United States Patent [19]

Segawa

[11] Patent Number: 5,033,022
[45] Date of Patent: Jul. 16, 1991

[54] SEMICONDUCTOR MEMORY DEVICE HAVING LOW NOISE BIT LINE STRUCTURE

[75] Inventor: Machio Segawa, Tokyo, Japan
[73] Assignee: NEC Corporation, Tokyo, Japan
[21] Appl. No.: 516,588
[22] Filed: Apr. 30, 1990
[30] Foreign Application Priority Data Apr. 28, 1989 [JP] Japan .................................. 1-111048

[51] Int. Cl.⁵ .............................................. G11C 13/00
[52] U.S. Cl. ........................................ 365/63; 365/51; 365/206
[58] Field of Search ............................ 365/63, 51, 206

[56] References Cited
U.S. PATENT DOCUMENTS 4,916,661 4/1990 Nawaki et al. ..................... 365/51
4,980,860 12/1990 Houston et al. ..................... 365/51

Primary Examiner—Terrell W. Fears
Attorney, Agent, or Firm—Sughrue, Mion, Zinn, Macpeak & Seas

[57] ABSTRACT

A semiconductor memory device having an improved digit line structure which is capable of carrying out a low-noise operation is disclosed. The semiconductor memory device has in each column a digit line pair and a sense amplifier connected to the digit line pair. Each pair of digit lines are composed of a plurality of first wirings formed of a first conductor layer and a plurality of second wirings formed of a second conductor layer isolated from the first conductor layer through an insulating layer. One of the digit lines of each digit line pair is formed by electrically connecting part of the first wiring and part of the second wiring, and the other digit line of the digit line pair is formed by electrically connecting the other part of the first wiring and the other part of the second wiring.

5 Claims, 7 Drawing Sheets

SEMICONDUCTOR MEMORY DEVICE HAVING LOW NOISE BIT LINE STRUCTURE

BACKGROUND OF THE INVENTION

The present invention relates to a semiconductor memory device, and more particularly to a dynamic type semiconductor information storage device which employees dynamic memory cells.

In a semiconductor memory device a large number of memory cells are arranged in a matrix form of rows and columns, and a word line and a digit line pair are arranged for each row and column, respectively. A sense amplifier is connected to each pair of bit lines. The memory cell that is connected to a selected word line gives a minute differential signal to the bit line pair connected thereto, and the minute differential signal is amplified by the sense amplifier that is connected to the digit line pair. Thus, the digit line on the high potential side is charged to a power source potential (Vcc) and the digit line on the low potential side is discharged to the ground potential.

Along with the recent progress in the information storage capacity of the semiconductor memory device, the memory cell is miniaturized and the digit lines are adjacently disposed with a small distance therebetween. As a result, the capacitive coupling between the adjacent digit lines is becoming large while the read-out voltage to the digit line is becoming small due to the miniaturization of the memory cell. Accordingly, the respective digit lines are mutually influenced from the changes in the potential due to the amplification by the sense amplifiers of the adjacent digit lines, so that the noise-signal ratio is becoming deteriorated and the read-out margin is becoming decreased.

In order to resolve the above-mentioned problems the so-called twisted digit line structure is proposed, for example, in U.S. Pat. No. 3,942,164. In accordance with this technique, the pair of digit lines of one column mutually interchange their locations at the midpoint of the length of these digit lines, and the pair of digit lines of another column adjacent to the above one column mutually interchange their locations at the point of one quarter and again at the point of three quarters of their length. According to such structure of the digit lines, between the digit lines of the adjacent columns, the coupling capacitance between one digit line and one adjacent digit line to be charged and, the coupling capacitance between the one digit line and another adjacent digit line to be discharged have substantially equal capacitance values. For this reason, noises to the one pair of digit lines from the adjacent pairs of digit lines caused by the amplifying operation are canceled each other. However, the parasitic capacitance between the digit lines in the same digit line pair for each column still has a large value so that at the time of amplifying the minute signal read out on each pair of digit lines the capacitance between the digit lines acts to reduce the output of the differential sense amplifier.

Hence, the increase in the capacitance between the digit lines of each pair reduces the speed of the sensing operation and reduces the operational margin, which has been a big obstacle to the effort of increasing the operating speed.

SUMMARY OF THE INVENTION

It is an object of the present invention to provide a semiconductor memory device which enables to prevent the occurrence of malfunction's through reduction of the parasitic capacitance between the digit lines.

It is another object of the present invention to provide a semiconductor memory device which enables a low-noise and highly sensitive read-out operation.

A semiconductor memory device according to the present invention comprises a pair of digit lines connected to each sense amplifier, one of each pair of digit lines and the other digit line interchanging their locations on a memory plane by crossing each other at least once in a crossing region, and is featured in that, in a region located on one side of the crossing region, the one digit line is formed as a first conductor layer and the other digit line is formed as a second conductor layer isolated from the first conductor layer through an insulating layer, and in the region on the other side of the crossing region, the above one digit line is formed as the second conductor layer and the above other digit line is formed as the first conductor layer.

According to the present invention, one of a pair of digit lines is formed as the first conductor layer and the other digit line is formed as the second conductor layer formed on an insulator film over the first conductor layer, and therefore, adjacent digit lines are formed on layers which are mutually different (namely, the first conductor layer and the second conductor layer) and there is necessarily interposed the insulator film between the digit lines. Thus, the effective separation distance between the digit lines is enlarged compared to the conventional case. As a result, the effectively coupling capacitance between the adjacent digit lines can be reduced and the signal coupling between each pair of digit lines can be suppressed.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Figure 1:
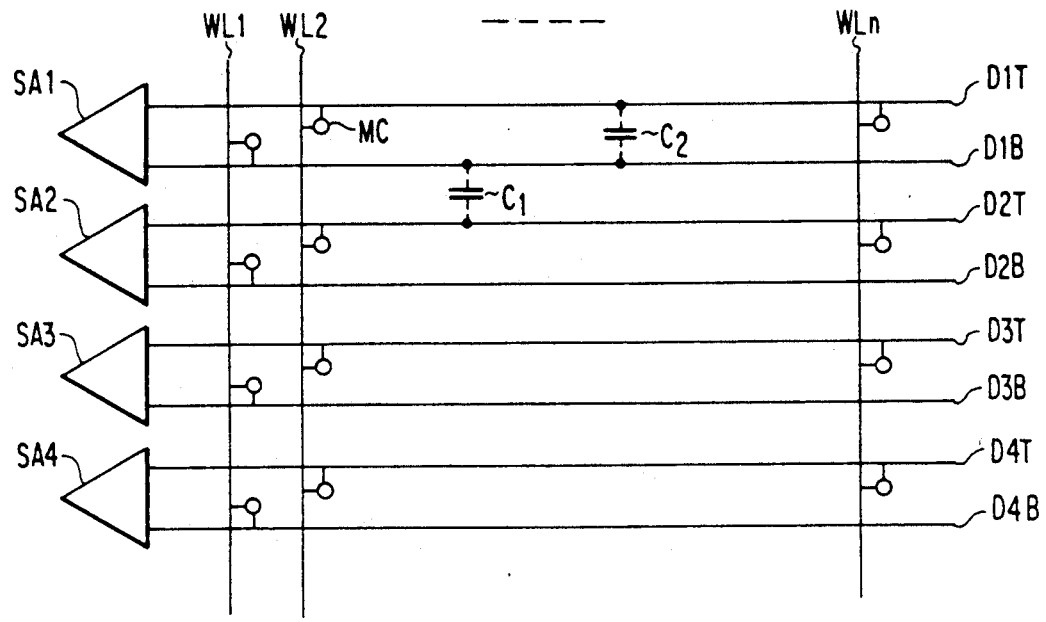
FIG. 1 is a block diagram showing a specific construction of the cell array for the conventional dynamic memory device.

FIG. 1 is a schematic diagram showing the basic structure of the semiconductor memory device according to the conventional layout of the memory array.

A large number of dynamic memory cells MC each having one transistor and one capacitor are arranged in a matrix form of rows and columns. Word lines WL1, WL2, . . ., WLn are arranged for the respective rows and digit line pairs D1T, D1B; D2T, D2B; . . . are arranged for the respective columns. Further, sense amplifiers SA1, SA2, . . . are connected to the respective columns of digit line pairs. Each sense amplifier amplifies the signal difference in the digit line pair connected thereto, and the potential of the digit line on the high potential side is charged to a power source potential (Vcc) while that of the digit line on the low potential side is discharged to the ground potential.

In the case of realizing a high density semiconductor memory device there are formed parasitic capacitances C1 and C2 between the adjacent digit lines. Because of this, when all of the digit lines are formed in parallel with each other, they are subject to the influence of the states of the adjacent digit lines. For example, when the voltage of the digit line D1B changes, the digit D2T adjacent to the digit line D1B changes its potential through the coupling capacitance C1 under the influence of the digit line D1B. Therefore, when a signal voltage is applied from the memory cell to the digit line D2T, there will be obtained a voltage which is different from the prescribed signal voltage. Then, the size relation between the voltage of the digit line D2T and the voltage of the digit line D2B which forms a digit line pair with the digit line D2T may become different from what was originally intended. As a result, the sense amplifier SA2 may erroneously carry out a differential amplification which is the opposite to what was originally intended.

For example, when a low level signal is read out from the digit line D2T and a high level signal is read out from the digit line D1B, and they are to be amplified to the ground potential and a power source potential Vcc, respectively, mutually opposing influences are given to the digit line D2T and the digit line D1B via the parasitic capacitance C1. Thus, the operating margin of the device is decreased.

Figure 2:
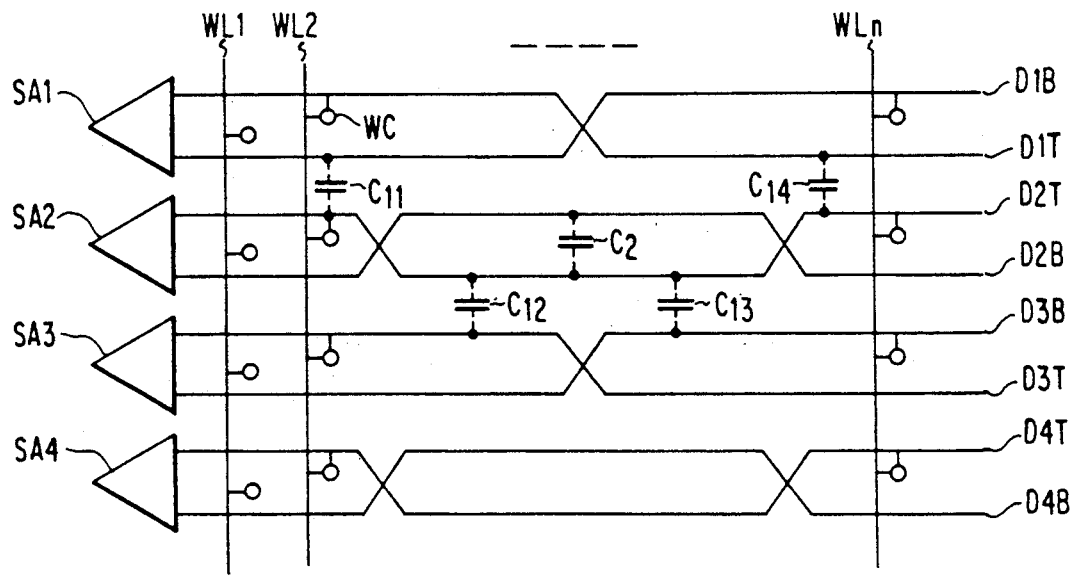
FIG. 2 is a block diagram showing a memory array by the twisted digit line structure.

FIG. 2 is a diagram showing a memory array with the so-called twisted digit line structure that will resolve the aforementioned disadvantages. The structure is described in detail in the U.S. Pat. No. 3,942,164.

As shown in FIG. 2, according to the structure explained above, pairs of digit lines such as (D1B, D1T), (D3B, D3T) connected to sense amplifiers such as SA1, SA2 are interchanged their locations at the points of one-half of their total length. Pairs of digit lines such as (D2T, D2B), (D4T, D4B) connected respectively to sense amplifiers such as SA2, SA4 are interchanged their locations at the points of one quarter as well as at the points of three quarters of the total length of the digit lines. With the above arrangement, the two digit lines connected to the same sense amplifier have totally equal lengths with respect to other adjacent digit lines, so that they have equal parasitic capacitances. Accordingly, the influences of other digit lines on a pair of digit lines are canceled and the affection of the voltage between pairs of digit lines is remarkably lowered, and the malfunctions can be avoided.

For example, when the digit line D2T is considered, it is coupled with the digit lines D1B and D1T that are connected to the sense amplifier SA1 via the parasitic capacitances $C_{11}$ and $C_{14}$, respectively. On the other hand, the digit line D2T is coupled with the digit lines D3T and D3B that are connected to the sense amplifier SA3 via the parasitic capacitances $C_{12}$ and $C_{13}$. The parasitic capacitances $C_{11}$ and $C_{14}$ have substantially equal values as may clearly be understood from their respective physical arrangements, and the parasitic capacitances $C_{12}$ and $C_{13}$ also have substantially equal values for the same reason. Now, the digit lines D1T and D1B and the digit lines D3T and D3B undergo potential changes that are opposite with each other. Accordingly, the influences of the adjacent digit line pairs to the digit line D2T cancel each other. However, the parasitic capacitance $C_2$ between the digit line pair is not diminished at all.

Figure 3:
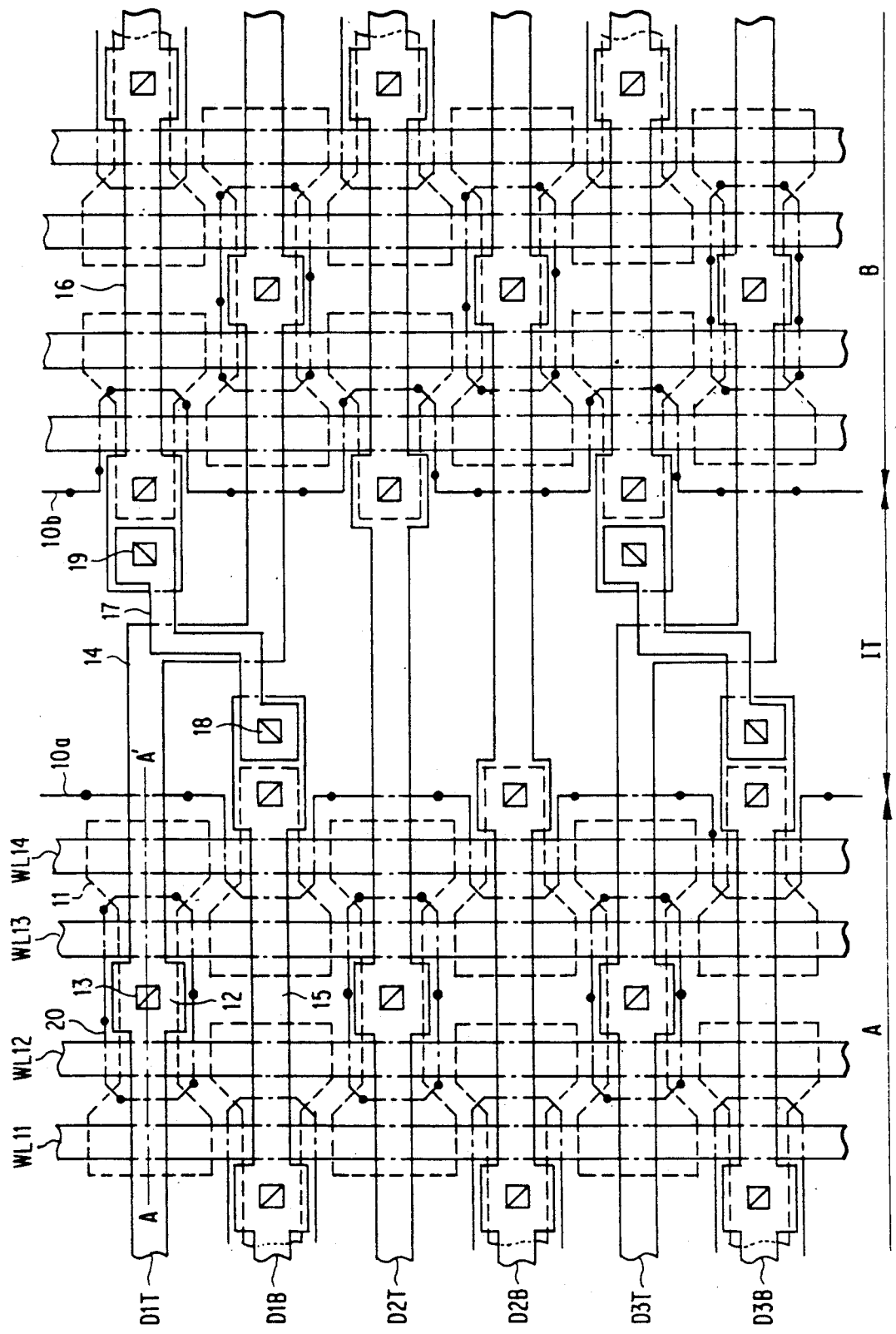
FIG. 3 is a plan view showing an example of memory array layout according to the twisted digit line structure in the prior art.

FIG. 3 is a plan view showing the prior art memory device in which the above-mentioned art is realized.

In memory cell regions A, B and the like are laid out a plurality of memory cells, and each memory cell is connected to a pair of digit lines that are connected to one of sense amplifier among a plurality of sense amplifiers (not shown).

In each of the memory cell regions A and B isolated by a crossing region IT, digit lines are arranged in the mutually parallel state, and a crossing region IT is provided between the memory cell regions and the locations of a pair of digit lines are interchanged in the crossing region. For example, the digit line D1T and the digit line D1B have opposite configurations in the memory cell region A and the memory cell region B. In the memory cell region A, the digit lines D1T and D1B are arranged in parallel by aluminum wirings 14 and 15, respectively, that are formed on the same level. In the crossing region IT, the wiring 14 changes its location to the lower lane and the wiring 15 is connected in the crossing region to the wiring in the upper lane of the memory cell region B via contacts 18 and 19 by way of a crossing wiring 17 that crosses the wiring 14 via an insulator film (not shown). Note that the wiring 16 is on the same level as that of the wirings 14 and 15.

Figure 4:
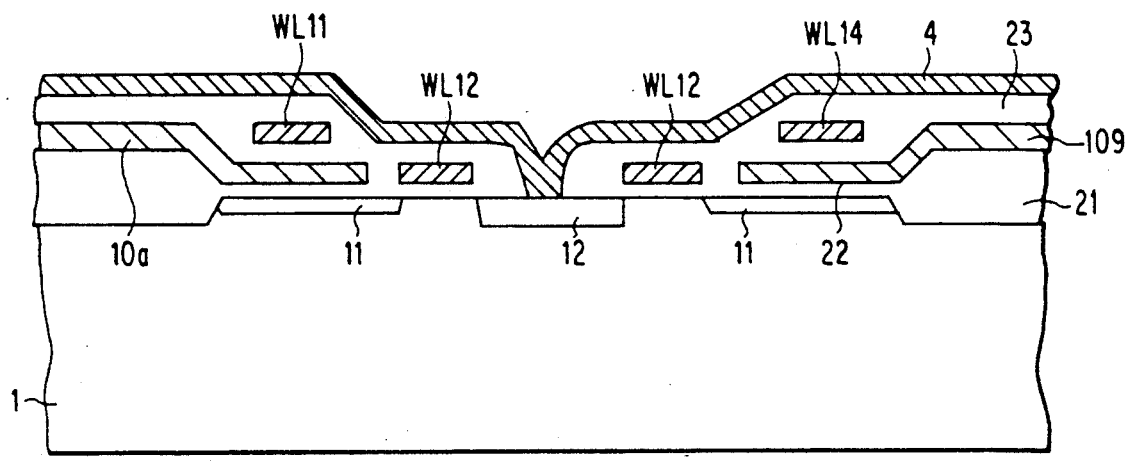
FIG. 4 is a diagram showing the cross section along the line A—A' in FIG. 3.

The structure of two memory cells formed adjacently along the line A—A' in FIG. 3 is shown in FIG. 4. In an active region surrounded by a field insulator film 21 on a P type semiconductor substrate 1, there are formed an N type region 11 and an N type lead-out region 12 as lower capacitor electrodes. Over the active region, an upper capacitor electrode is formed by a polysilicon layer 10a via a thin gate insulator film 22. Polysilicon word lines WL12 and WL13 located in a window 20 of the polysilicon layer 10a formed on the insulator film 22 serve as the gates of the respective cell transistors. Polysilicon word lines WL11 and WL14 connected to the other cell are extending above the polysilicon layer 10a via an insulator film 23. The conductor 14 as a digit line is connected to the region 12.

As explained above, the digit lines D1T and D1B are both formed as the first conductor layers 14, 15 and 16, 14, and are arranged in parallel. In the crossing zone IT, there is formed a second conductor layer 17 in the first conductor layer via an internal insulator film. In the crossing zone IT, the digit line D1T is formed in the first conductor layer 14 bent in the form of a crank. On the other hand, the digit line D1B is connected to the wiring 17 formed in the second conductor layer crossing over the digit line D1T via contacts 18 and 19. In this way, the positions of the digit lines D1T and D1B on the plane in the memory cell region A is in the reversed relation to the locations of the digit lines D1T and D1B on the plane in the memory cell region B.

However, in spite of the fact that in the prior art memory device described in FIG. 3 above, the influences of the potential change from the adjacent digit line pairs can be canceled, it is not possible to reduce the parasitic capacitance ($C_2$) between the digit lines in each digit line pair, which remains as an obstacle to the effort for improving the sensitivity and the speed of the read-out.

Next, referring to FIG. 5, the basic constitution of the present invention will be described.

Each of the digit lines has a total length of x, and the odd-numbered digit line pairs (D1T, D1B; D3T, D3B; . . .) interchange the locations of the digit lines within the respective pair at the positions with distance x/2 from the respective ends of the digit lines while the even-numbered digit line pairs (D2T, D2B; D4T, D4B; . . .) interchange the locations of the digit lines within the respective pair at the positions with distance x/4 as well as at the positions with distance 3x/4. One set of the digit lines (D1B, D3B, . . .) of the odd-numbered digit line pairs are formed over the length of up to x/2 by the wirings L12 formed as the first conductor layers, and formed over the length from x/2 to x, in addition to the location interchange, by the wirings L13 formed as the second conductor layers isolated from the first conductor layers via the respective isolator films. Further, the other set of digit lines (D1T, D3T, . . .) are formed over the length of x/2 by the wirings L11 of the second conductor layers, and over the length from x/2 to x formed as the wirings L14 of the first conductor layers.

One set of the digit lines (D2T, D4T, . . .) of the even-numbered digit line pairs are formed over the length up to the length of x14 and over the portions with length from 3x/4 to x as the wirings for the first conductor layers L24 and L26, respectively, and the portions with length from x/4 to 3x/4 are formed as wirings L22 for the second conductor layers. In this way, in each of the digit lines, the wiring portion of the first conductor layer and the wiring portion of the second conductor layer have respectively the length of x/2, and have substantially equal wiring capacitances. Further, the adjacent wirings are formed on mutually different layers so that the effective separation distance between the each adjacent digit lines becomes large and the parasitic capacitance between the digit lines can be made small.

Next, referring to FIG. 4 to FIG. 9, an embodiment of the present invention will be described. In connection with this it should be mentioned that the portions that correspond to the previous drawings will be given identical or similar reference symbols and detailed description will be omitted.

Figure 5:
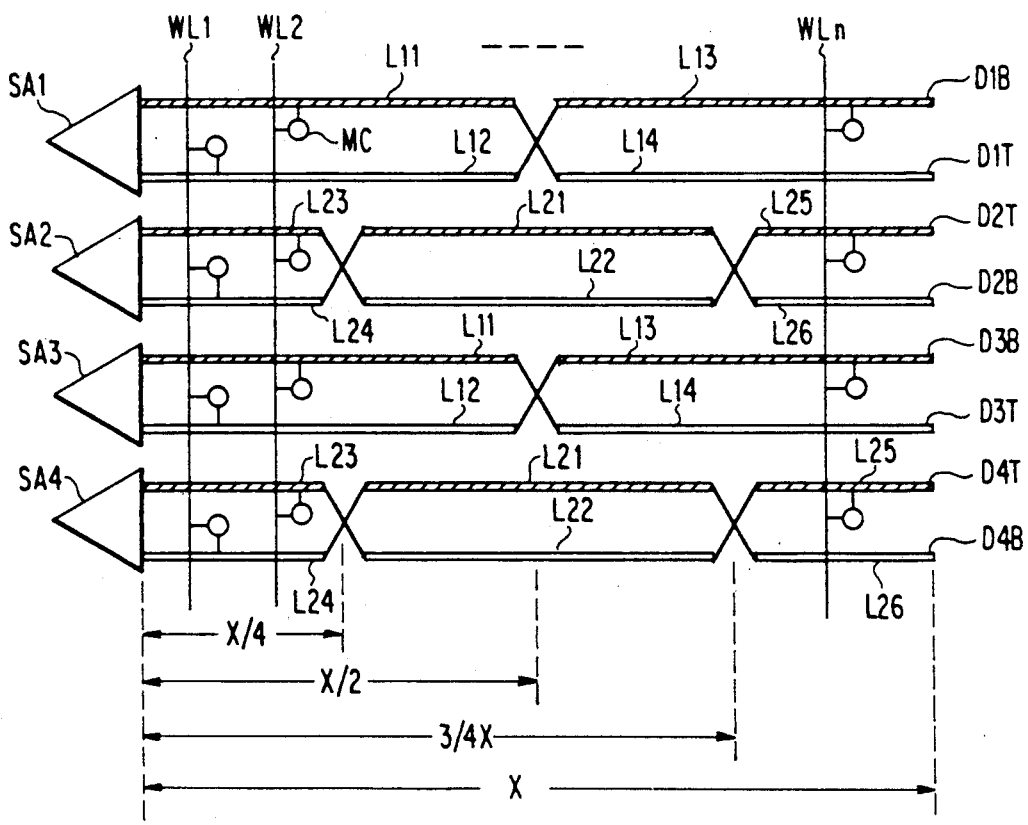
FIG. 5 is a schematic diagram showing the basic structure of the present invention.
Figure 6:
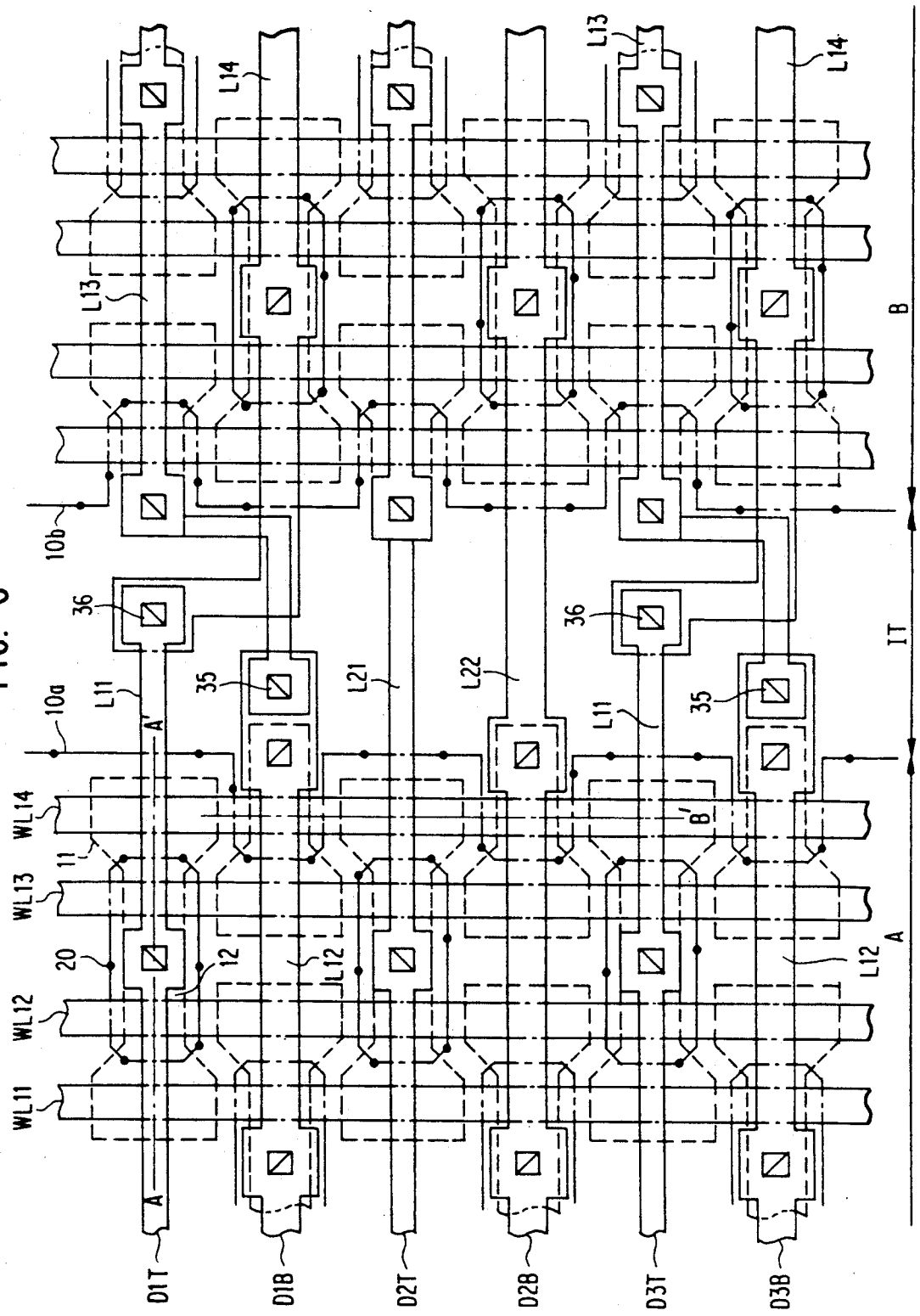
FIG. 6 is a plan view showing the layout of memory array according to an embodiment of the present invention.
Figure 7:
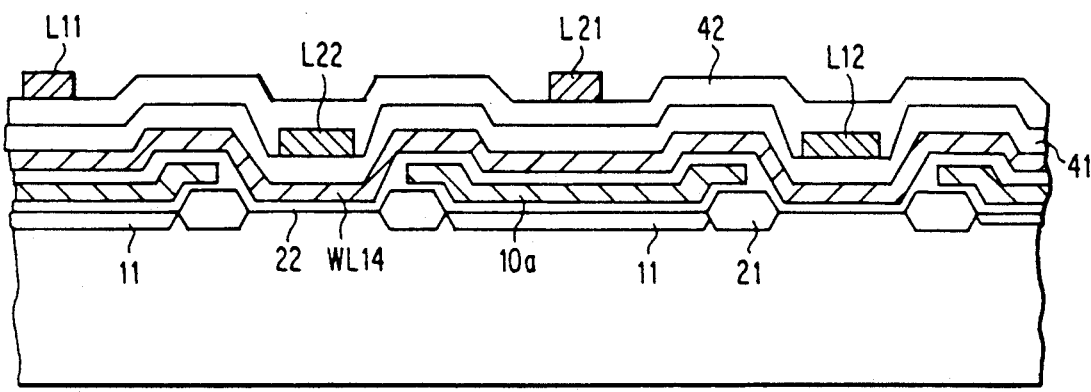
FIG. 7 is a sectional diagram along the line B—B' in FIG. 6.

FIG. 6 is a plan view showing a plan view of the semiconductor memory device according to the embodiment of the present invention taken in the vicinity of x12 in FIG. 5, and FIG. 7 is a sectional view of the device containing the line B—B' in FIG. 6. It should be mentioned that the sectional view of the device containing the line A—A' is similar to that shown in FIG. 4.

In a semiconductor substrate 1, there are provided a plurality of memory cell regions A, B and the like and between the memory cell regions there are provided crossing regions IT for digit lines. In each memory cell region, there are arranged a plurality of memory cells, and each memory cell is connected to digit lines D1T, D1B; D2T, D2B; D3T, D3B and the like that are connected to the corresponding sense amplifier (not shown).

On the semiconductor substrate 1, first conductor layers L12, L14 and L22 are formed by aluminum or the like via an insulator film 41. Then, on these first conductor layers second conductor layers L11, L13 and L21 are formed by aluminum or the like via an internal insulator film 42 formed all over the surface.

In the memory cell region A, the digit lines D1B, D2B, D3B and the like are formed by the first conductor layers L12 and L22, and the digit lines D1T, D2T, D3T and the like are formed by the second conductor layers L11 and L21. Further, in the memory cell region B that is adjacent to the memory cell region A via the crossing region IT, the digit line D1T, D2B, and the like are formed by the first conductor layers L14 and L22, and the digit lines D1B, D2T, D3B and the like are formed by the second conductor layers L13 and L21. The digit lines D1T, D3T and the like that extend to the crossing region IT from the second conductor layer L11 in the memory cell region A are connected to the digit lines D1T, D3T and the like that are bent in L shape by extending to the crossing region IT from the first conductor layer L14 in the memory cell region B via contacts 36.

Further, the digit lines D1B, D3B and the like that extend from the first conductor layer L12 in the memory cell region A are connected to the digit lines D1B, D3B and the like bent in crank form via contacts 35. In this way, the digit lines D1B, D3B and the like are largely separated from the digit lines D1T, D3T and the like that form digit line pairs with the digit lines D1B, D3B and the like, in the crossing region IT.

It should be noted that the digit lines D2T and D2B do not cross in the crossing region IT, but they are formed crossing in other crossing region. Then, all of the digit lines cross the digit lines that are to form the respective digit line pairs for once or twice. Further, each digit line is formed so as to have equal lengths for the portion formed by the first conductor layer and the portion formed by the second conductor layer. Therefore, the respective capacitances of the digit lines D1T and D1B are made to have equal values.

Figure 8:
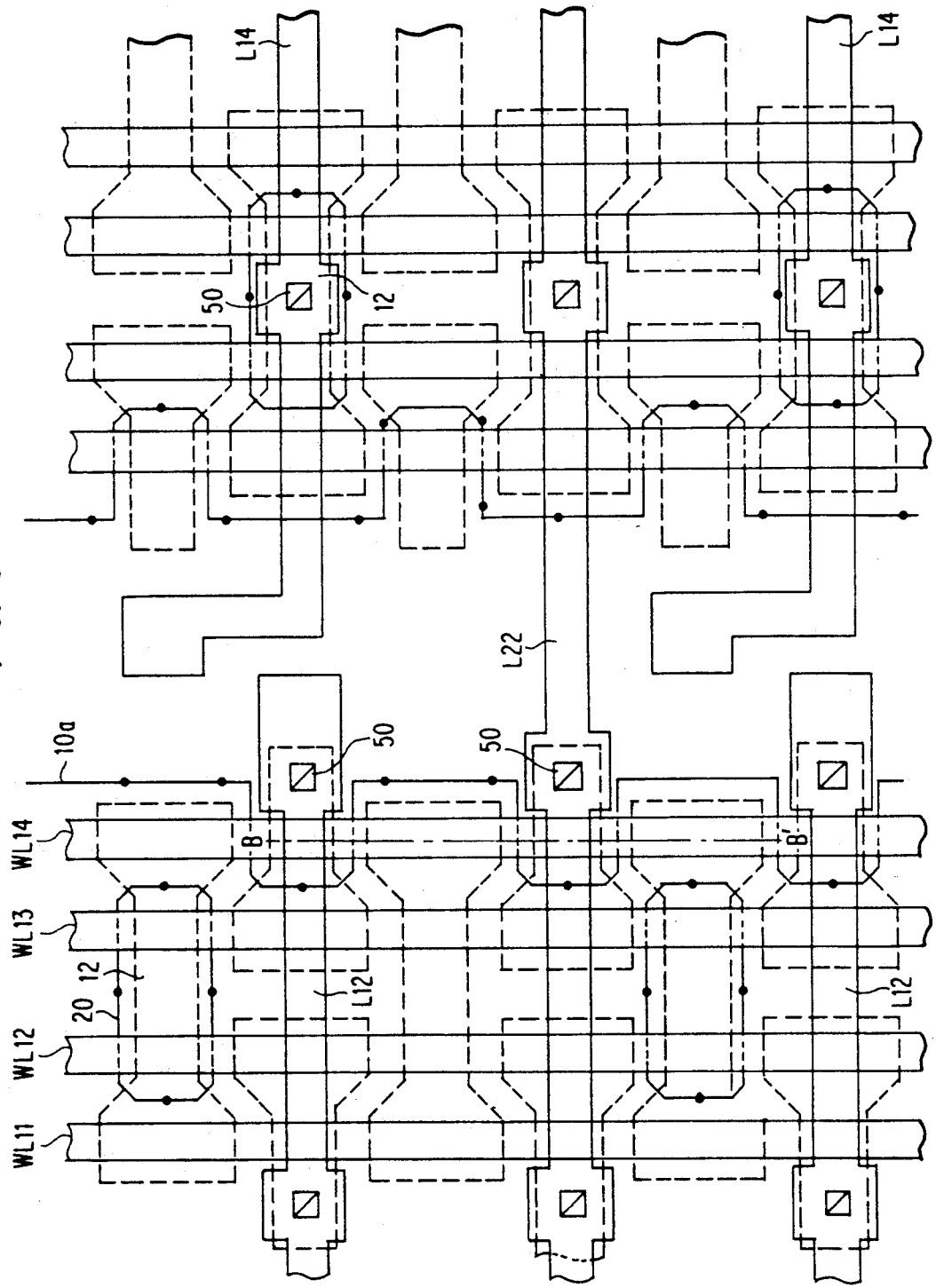
FIG. 8 is a plan view showing a first fabrication step of the embodiment in FIG. 6.

Next, referring to FIG. 8 to FIG. 10, the principal fabrication steps of the embodiment shown in FIG. 5 will be described. FIG. 8 shows the state in which N type regions 11 as the lower electrodes for the capacitors of the memory cells and N type common source regions 12 for the transistors of the two adjacent memory cells are formed on a P type substrate, the common upper electrodes are formed by first polysilicon layers 10a and 10b on the substrate via an insulator film (corresponding to 21 and 22 in FIG. 4), and word lines WL11, WL12, WL13, . . . are formed by second polysilicon layers. The word lines that are located in the openings 20 of the polysilicon layers 10a and 10b serve as gates of the cell transistors.

Figure 10:
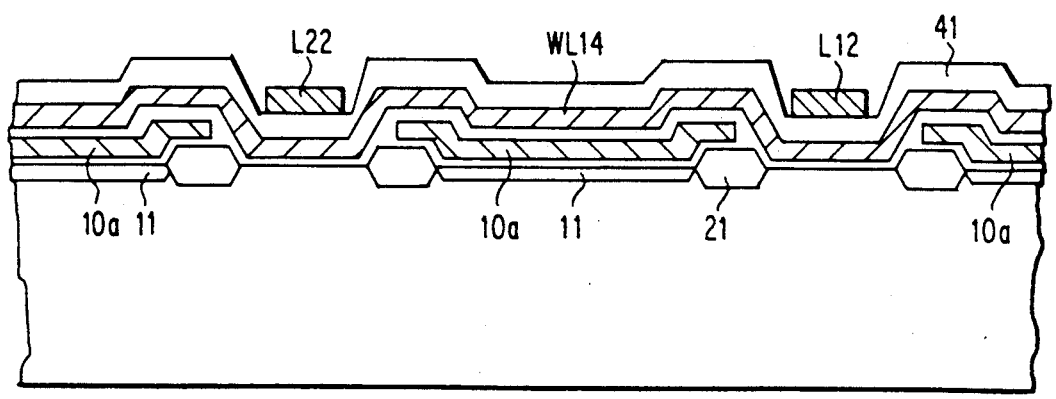
FIG. 10 is a sectional diagram containing the line B—B' in FIG. 9.
Figure 9:
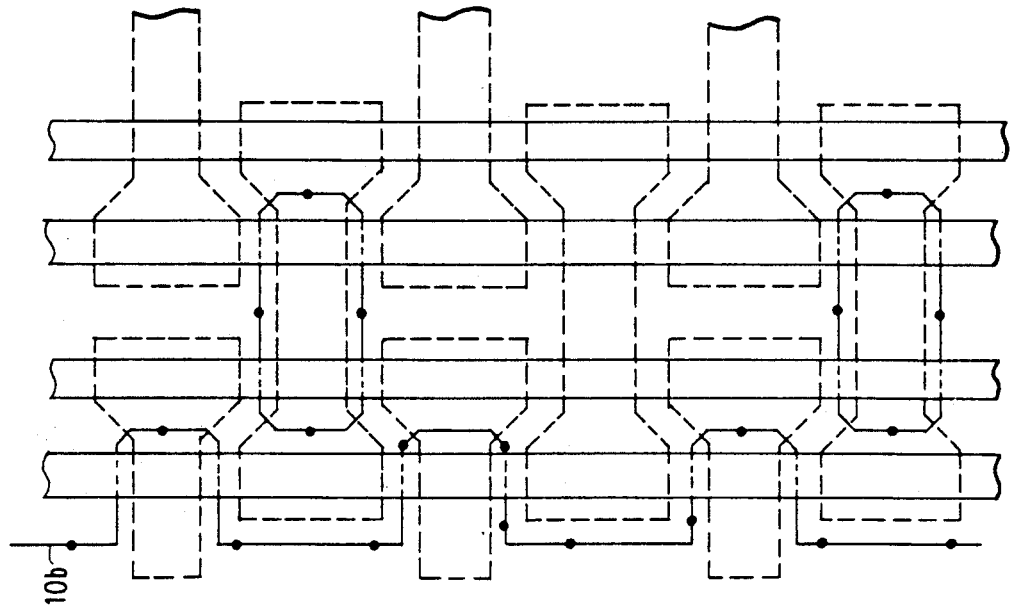
FIG. 9 is a plan view showing a second fabrication step of the embodiment in FIG. 6.
Figure 9:
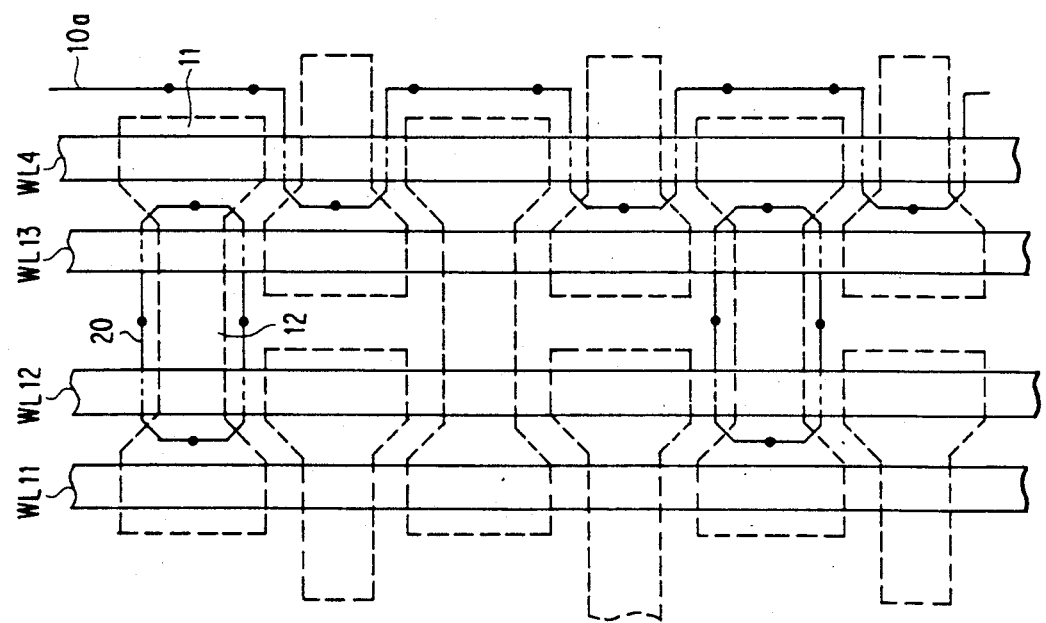

Next, as shown in FIG. 9 and FIG. 10, wirings L12, L14 and L22 by the first conductor layer of aluminum or the like are formed by the well-known patterning method after forming an insulator film 41 on the surface of the substrate. These wirings L12, L14 and L22 are connected to the source regions 12 of the memory cells via contacts 50 as shown in the figure.

Then, after the formation of an internal insulator film 42, second conductor layers L11, L13 and L21 are formed to obtain the structure as shown in FIG. 6 and FIG. 7.

As described in the above, according to the present invention, adjacent digit lines are formed separately in the first conductor layers and the second conductor layers formed via the insulator films, so that the effective distance between the digit lines is made large in comparison to the conventional case. Therefore, the coupling capacitance between the digit lines can be made small. Because of this, there is obtained an effect that the change in the signal voltage of the digit lines can be reduced and, as a result, suppress the malfunctions of the sense amplifier.

What is claimed is:

1. A semiconductor memory device having memory cells arranged in a matrix form of rows and columns, word lines provided for the respective rows of the memory cells, digit line pairs provided for the respective column of the memory cells, and sense amplifiers connected to the respective digit line pairs, said digit line pairs being divided alternately into a first and a second groups, the digit line pairs of said first group having a first and a second wirings that sequentially extend in a first longitudinal lane in along a direction of the columns and a third and a fourth wirings that sequentially extend in a second longitudinal lane parallel to said first longitudinal lane, said first and second wirings being formed as a first conductor layer and said third and fourth wirings being formed as a second conductor layer via an insulator layer which is isolated from said first conductor layer through an insulating layer, said first and fourth wirings being electrically connected to constitute one digit line of said first group of digit line pair and said third and second wirings being electrically connected to constitute the other digit line of said first group of digit lines pair.

2. A semiconductor memory device as claimed in claim 1, wherein each of said second group of digit line pairs having a fifth to a seventh wirings sequentially formed as said first conductor layers in a third longitudinal lane in a direction of the and an eighth to a tenth wirings sequentially formed as said second conductor layers in a longitudinal zone parallel to said third longitudinal lane, said fifth, ninth and seventh wirings being electrically connected to constitute one digit line of said second group of digit line pair, said eighth, sixth and tenth wirings being electrically connected constituting the other digit line of said second group of digit line pair.

3. A semiconductor memory device as claimed in claim 1, wherein said first to fourth wirings have lengths substantially equal to x12 where x is the length of each of said digit lines.

4. A semiconductor memory device as claimed in claim 1, wherein said fifth, seventh, eighth and tenth wirings have respective lengths substantially equal to x14, and said sixth and ninth wirings have lengths substantially equal to x12 where x is the length of each of said digit lines.

5. A semiconductor memory device comprising a plurality pairs of digit lines connected to a corresponding sense amplifier and one digit line of each pair of digit lines and the other digit line of the same pair interchange their locations on a plane by mutually crossing at least once in a crossing region, one of the digit lines of each pair of digit lines being formed as a first conductor layer and the other digit line of said digit line pair being formed as a second conductor layer formed on said first conductor layer via an insulator film in a region located on one side of said crossing region, said one digit line is formed as the second conductor layer and said other digit line being formed as the first conductor layer in the other region located on the other side of said crossing region, the first conductor layer and the second conductor layer of each digit line being connected in said crossing region via a contact formed in said insulator film.

* * * * *